United States Patent
Decre et al.

(10) Patent No.: US 6,951,818 B2
(45) Date of Patent: Oct. 4, 2005

(54) METHOD OF MANUFACTURING AN ELECTRONIC DEVICE

(75) Inventors: Michel Marcel Jose Decre, Eindhoven (NL); Andreas Hubertus Montree, Leuven (BE); Jacobus Bernardus Giesbers, Eindhoven (NL); Gerwin Hermanus Gelinck, Eindhoven (NL); Martin Hillebrand Blees, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 10/476,708

(22) PCT Filed: May 6, 2002

(86) PCT No.: PCT/IB02/01579
§ 371 (c)(1),
(2), (4) Date: Nov. 4, 2003

(87) PCT Pub. No.: WO02/091460
PCT Pub. Date: Nov. 14, 2002

(65) Prior Publication Data
US 2004/0132314 A1 Jul. 8, 2004

(30) Foreign Application Priority Data
May 8, 2001 (EP) .......................................... 01201655

(51) Int. Cl.$^7$ ........................ H01L 21/31; H01L 21/311
(52) U.S. Cl. ........................ 438/694; 438/618; 438/710; 438/725; 438/761; 438/780; 438/781
(58) Field of Search ................................ 438/618, 694, 438/710, 725, 761, 780, 781

(56) References Cited

U.S. PATENT DOCUMENTS 6,284,149 B1 * 9/2001 Li et al. ........................ 216/64
6,559,070 B1 * 5/2003 Mandal ........................ 438/781

* cited by examiner

*Primary Examiner*—David Nelms
*Assistant Examiner*—Renee R. Berry
(74) *Attorney, Agent, or Firm*—Peter Zawilski

(57) ABSTRACT

A vertical interconnect (15) in an electronic device (10) is manufactured non-photolithographically. This is done by modifying a surface (20,30) of either a metal layer (3) or an intermediate layer of an electrically insulating material (21), and subsequently depositing a composition with a first and a second polymer. Phase separation of the two polymers will lead to a first (6) and a second sub-layer (7), of which the first sub-layer (6) is removed. An upper layer (9) of electrically conducting material can be deposited then or after a further etching step. This results in the vertical interconnect (15).

10 Claims, 2 Drawing Sheets

METHOD OF MANUFACTURING AN ELECTRONIC DEVICE

The invention relates to a method of manufacturing an electronic device provided with a substrate having a first side, at which first side are provided in that order a first electrically conducting region, an intermediate layer of electrically insulating material, and a second electrically conducting region, an electrically conducting vertical interconnect being present between said regions.

Such a method is known from U.S. Pat. No. 4,702,792. In the known method, the intermediate layer is a polymeric radiation-sensitive layer, which is also referred to as a photoresist. This photoresist is exposed in accordance with a desired pattern and subsequently brought into contact with an etchant in which either the exposed or the non-exposed portion of the photoresist is dissolved. Openings are thus created in the photoresist in accordance with the desired pattern. Then an electrically conducting layer is provided on the photoresist, which layer comprises the second electrically conducting region and at the same time fills up the openings. A vertical interconnect is formed in this manner between the first and the second electrically conducting region. This vertical interconnect will also be referred to as a "via" hereinafter.

It is a disadvantage of the known method that an exposure step is necessary for forming the via.

It is accordingly an object of the invention to provide a method of the kind mentioned in the opening paragraph in which the via can be formed in a non-photolithographical manner.

This object is achieved in that the method comprises the following steps:

modifying a surface at the first side of the substrate in accordance with a desired pattern, which pattern defines the via, thus forming a modified portion and a remaining portion of the surface;

providing a composition on the surface, which composition comprises a first and a second polymer and a solvent, said solvent substantially wetting the surface, whereby a first and a second sub-layer are formed under phase separation, each of said sub-layers comprising substantially one of the polymers, while the first sub-layer lies on the first electrically conducting region;

etching the first sub-layer with a first etchant; and providing the vertical interconnect and the second electrically conducting region.

The method according to the invention utilizes the preferential adsorption of one of the polymers in the composition on the modified or on the remaining portion of the surface. The etching step causes a relief structure of electrically insulating material to remain. This relief structure may serve as the intermediate layer. In this case, the modified surface lies on a metal layer of which the first electrically conducting region forms part. Alternatively, the relief structure may serve as an etching mask for patterning the intermediate layer. In that case the modified surface will lie on the intermediate layer.

The steps of modifying a surface, providing a composition, and etching according to the invention are known from Böltau et al., *Nature* 391 (1998), 877–879. These steps are used by Böltau et al. for manufacturing lines and similar structures. These lines and structures, however, contain pinholes and other defects. They are accordingly not suitable for use if electronic devices are to be reliably manufactured.

The present invention, however, is based on three recognitions. First, the inventors have observed that the occurrence of the pinholes is not a problem for a via. A pinhole may on the one hand occur in the first sub-layer which lies on the electrically conducting region. This first sub-layer, however, is etched away, so that the pinhole is no longer present when the method according to the invention has been completed. On the other hand, a pinhole could occur in the second sub-layer. Since a via is an insulated structure, such a pinhole does not pose any risk of short-circuit. The use of the second sub-layer as an etching mask or as a dielectric, however, renders it undesirable that pinholes should occur.

The second recognition of the inventors is that this occurrence of pinholes is prevented if the subjacent surface is wetted by the solvent. Wetting takes place idealiter when the surface and the solvent have a mutual contact angle of 0°. With a contact angle between 0 and 180° there is a partial wetting. To ensure that wetting of the surface takes place, the choice of the solvent and that of the surface or the surface modification must be mutually attuned. Given a polar solvent such as tetrahydrofurane (THF), a suitable choice for the surface modification is a monolayer of 18-hydroxy-n-octadecylthiole (HO—$(CH_2)_{18}$—SH). For an apolar solvent such as toluene, a suitable choice for the surface modification would be a monolayer of n-octadecylthiole ($H_3C$—$(CH_2)_{17}$—SH). Examples of compositions and etchants are given in Table 1. The ratio between the first and the second polymer may vary; preferably, a ratio is chosen which corresponds to a certain degree to the ratio between the surfaces of the first and the second sub-layer.

Böltau et al. also noted that the phase separation can only occur for patterns having a dimension smaller than a characteristic length. The third recognition of the inventors is that this limitation of the dimension is not problematic for vias. Essentially, there are two limitations: a limitation of the dimension of the via and a limitation of a minimum mutual distance between two adjoining vias. The first limitation is not problematic because dimensions between 0.5 and 10 micrometers can be realized. The second limitation is not problematic either, because the mutual distance is comparatively great especially in the case of vias.

The surface modification may be realized, for example, in that a chemical reaction is made to take place at the surface or in that a—preferably very thin—layer is provided on the surface. Examples of methods of providing a layer on a surface in a desired pattern, for which no photolithography need be used, are inter alia ink jet printing, vacuum deposition with a shadow mask, and soft lithographic methods such as microwriting, micromachining, micromolding in capillaries, and microcontact printing.

In a favorable embodiment, the step of modifying the surface is performed by means of microcontact printing, whereby a monolayer is provided. A monolayer here denotes a layer with a thickness of one or a few molecules which arises through adsorption of the molecules at a surface, during which an effect known as "self-assembly" takes place. A first advantage of the use of microcontact printing is that the deposited layer on the surface is very thin and at the same time very well patterned. It is true in particular that this deposited monolayer again has a defined surface with a given polarity, which can be set as desired. A second advantage is that microcontact printing can be performed at normal pressure and temperature. A third advantage is that the pattern provided by contact printing can contain at least details of the order of magnitude of 0.5 to 10 micrometers. This resolution is very suitable for the use of vias, both as regards line width and as regards interspacing.

The composition with the first and second polymer preferable has a concentration of 0.5–3% by weight. If as first polymer polystyrene is used and as second polymer polyvinyl pyridine, it is preferred that the mutual solar ratio of the first and the second polymer is between 1 and 3. Then on gold horizontal layers, parallel to the substrate surface are formed. On the areas modified with microcontactprinting there is a lateral demixion, i.e. layers substantially perpendicular to the substrate surface are formed.

In a further embodiment, a composition is provided after the provision of the first monolayer, which composition comprises a compound which forms a second monolayer on the remaining portion of the surface. The first and the second monolayer each comprise a compound provided with an end group, which end group faces away from the surface after the formation of the respective monolayer. The end group of the compound of the second monolayer differs from the end group of the compound of the first monolayer in its polarity. The result is a full covering of the surface by monolayers. These monolayers in their turn have a surface again which is polar or apolar, depending on the group facing away from the metal layer.

It is a first advantage of the embodiment that the surface is protected against impurities in the form of volatile organic molecules or dust particles which are present in a cleanroom atmosphere or in the air. The creation of pinholes was found to be prevented thereby. This is true in particular for the surface of a metal layer, especially a surface of a gold layer. Without a protection, the impurities would locally cover or oxidize the surface of the metal layer. The result of this would be that a subsequently provided solvent does not or not sufficiently wet the surface locally, which would create pinholes.

It is a second advantage of the embodiment that the provision of the monolayer by means of microcontact printing is easier and less prone to defects. Microcontact printing utilizes a stamp with a patterned stamp surface in which cavities are provided. These cavities each have a rear surface which under normal circumstances lies at a distance of a few micrometers away from the stamp surface. If a cavity spans a larger surface area, there is a risk of this rear surface bulging and—undesirably—forming part of the stamp surface. Now if the modified portion of the surface has a greater surface area than the remaining portion, the cavities in the stamp surface will be comparatively small. The risk of bulging is limited thereby.

The problem of the formation of pinholes in dielectric layers provided from a liquid phase arises more widely, not just in combination with a via. Examples are the manufacture of pinhole-free layers of a photoresist, thin-film capacitors, and thin-film transistors. The problem arises essentially for each and every stack of a metal layer and a layer of dielectric material provided from the liquid phase. It was surprisingly found that this problem can be solved with the aid of an anti-contamination layer. Such a layer protects the metal surface against adsorption of dust particles and/or volatile organic molecules. The monolayer is a preferred embodiment of the anti-contamination layer. In an alternative embodiment, a thin oxide layer is present at the metal surface. Experimental results have demonstrated that the problem is solved both by a thin oxide layer and by a monolayer. Preferably, the layer of dielectric material is provided by spincoating or dip coating, and the layer comprises an organic material. Examples of metals and monolayers are listed in Table 1. Examples of organic dielectric materials are inter alia polyimide, polyvinyl alcohol, polyvinyl phenol, photoresists such as HPR504 and SU-8, and benzocyclobutene. This results in a uniform, pinhole free layer on a substrate having hydrophobic and hydrophilic areas.

The surface to be modified may be present on the first electrically conducting layer, which in that case forms part of a metal layer. The second sub-layer, which does not or substantially not lie on the first conducting region, then forms the intermediate layer.

Alternatively, the surface to be modified may lie on the intermediate layer. The sub-layer, which does not or substantially not lie on the first conducting region, forms an etching mask in this case. The monolayers used for this purpose should be resistant to the etchant with which the intermediate layer is etched. If the intermediate layer comprises $SiO_2$, the etchant preferably is a solution of HF in water in a concentration of 1%.

The second electrically conducting region is preferably provided as an upper layer of electrically conducting material. Such a material is preferably a metal, but it may alternatively be an electrically conducting polymer, a polymer filled with electrically conducting particles, or a layer of amorphous or polycrystalline silicon which may or may not be doped. Known techniques may be used for providing this layer or this region. The via between the first and the second electrically conducting region results therefrom.

Vias manufactured by the method according to the invention are present, for example, in the back-end portion of an integrated circuit. This back-end portion may thus be manufactured at least partly by a non-photolithographical method.

Alternatively, the vias manufactured by the method according to the invention may be present in a thin-film device. Examples of these are inter alia networks of passive components, thin-film transistors, and picture screens operating with a liquid crystal or electroluminescent layer. The via in this embodiment will lie next to the capacitor, the coil, or the transistor. Various functions are accordingly defined in the layers: the metal layer comprises besides the first electrically conducting layer, for example, a gate electrode of a transistor; the intermediate layer is at the same time the dielectric; and the conducting layer comprises not only the second electrically conducting region but also a source and a drain electrode. A channel layer of semiconductor material is preferably present on this conducting layer; the semiconductor material is, for example, amorphous silicon, an oligomer such as pentacene or oligothiophene, or a polymer such as a poly-3-alkylthiophene or poly(thienylenevinylene). Advantages of such thin-film devices are inter alia the small number of layers and the resulting small number of process steps. A further advantage is the flexibility of the thin-film device in a number of cases.

To reduce the contact resistance of the via, it is advantageous to remove the sub-layer on the first conducting region before the second electrically conducting region is provided. This may be done in various ways, for example by a treatment with UV radiation, a plasma, in particular a rare gas plasma, or a heating step.

These and other aspects of the method and the device according to the invention will be explained in more detail with reference to Figures, Tables, and a description, wherein:

Table 1 lists a few embodiments of the composition used in the method and accompanying etchants;

Table 2 lists a few embodiments of monolayers which are suitable for certain surface;

TABLE 1 composition and etchants

| first polymer | second polymer | solvent | etchant for first polymer | etchant for second polymer |
|---|---|---|---|---|
| polystyrene | polyvinyl-pyridine | tetrahydro-furane | cyclohexane | ethanol |
| polystyrene | partly brominated polystyrene | tetrahydro-furane | cyclohexane | |
| polystyrene | polymethyl-metacrylate | tetrahydro-furane, methylethyl-ketone, toluene | cyclohexane | acetic acid |

TABLE 2 suitable monolayers for adsorption at specific surfaces

| surface | Material class of monolayer | preferred material for monolayer |
|---|---|---|
| Au, Pd | thiols | $C_{16/20}$—SH |
| Pt | thiols | $C_{16/20}$—SH |
| | cyanide | $C_{16/20}$—NC |
| Ag | thiols | $C_{16/20}$—SH |
| Al | phosphonates | $C_{16/20}$—PO(OH)$_2$ |
| | carboxylates | $C_{16/20}$—COOH |
| Cu | alkanethiols | $C_{16/20}$—SH |
| | alkylhydroxamic acid | $C_{15/19}$—CO—NH—OH |
| Mo | silanes | $C_{16/20}$—SiCl$_3$ |
| ITO | phosphonates | $C_{16/20}$—PO(OH)$_2$ |
| | silanes | $C_{16/20}$—SiCl$_3$ |
| SiO$_2$ | silanes, siloxanes | $C_{16/20}$—SiCl$_3$ |

Figure 1:
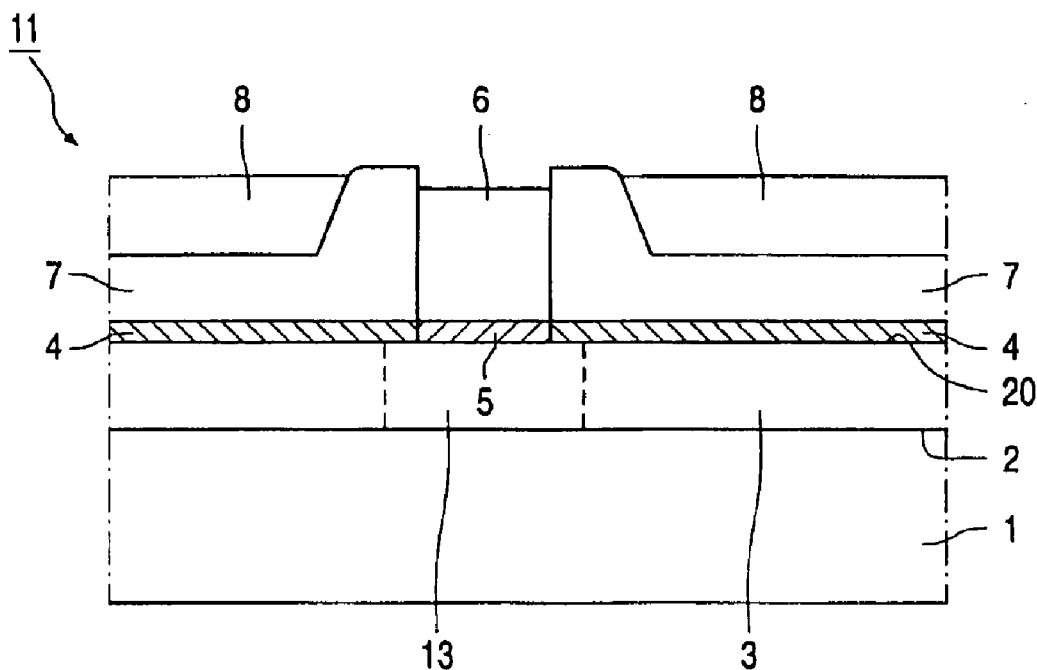
FIG. 1 is a diagrammatic cross-sectional view of a semi-manufactured product resulting from a first embodiment of the method.

FIG. 1 shows a semi-manufactured product 11 provided with a substrate 1 having a first side 2. At said first side 2 there is a metal layer 3 in which a first electrically conducting region 13 is defined. The surface 20 of the metal layer is modified. To this end, a first monolayer 2 and a second monolayer 5 are deposited on the surface 20 of the metal layer 3, such that the second monolayer 5 lies on the first electrically conducting region 13. A composition of a first and a second polymer is provided on the monolayers 4, 5. The composition has split up through phase separation into a first sub-layer 6, a second sub-layer 7, and a third sub-layer 8. The first 6 and the third sub-layer 8 mainly comprise the first polymer, the second sub-layer 7 mainly comprises the second polymer. The first sub-layer 6 is present in the first conducting region 13.

Figure 2:
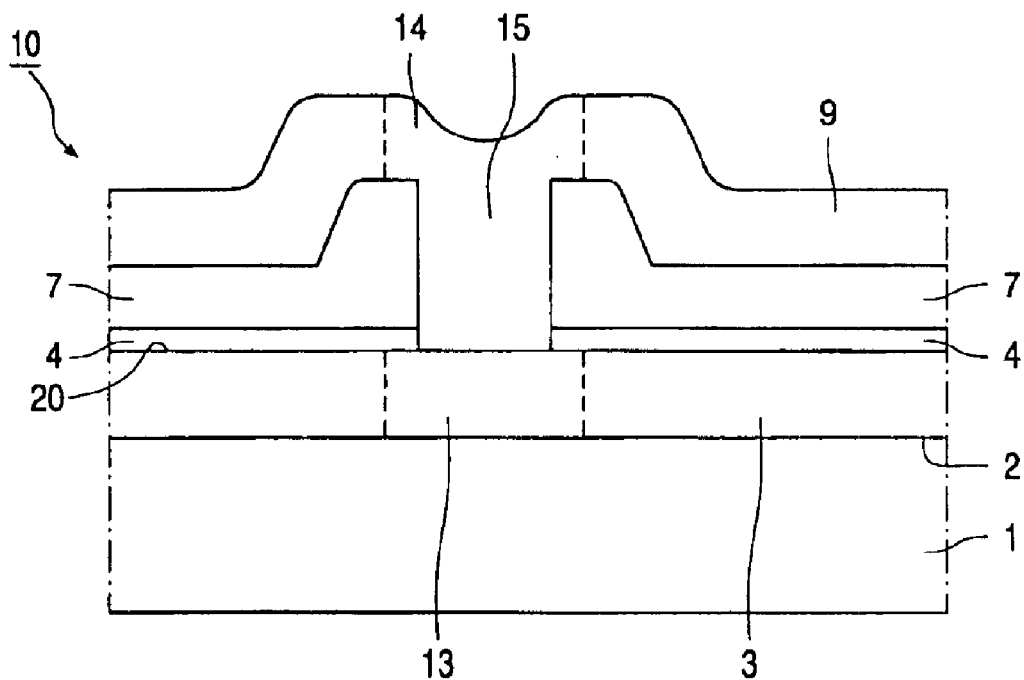
FIG. 2 is a diagrammatic cross-sectional view of a device resulting from the first embodiment of the method.

FIG. 2 shows the resulting electronic device 10 after the semi-manufactured product 11 had been further developed. After selective dissolving of the first 6 and the third sub-layer 8, the second monolayer 5 is removed. Then an electrically conducting layer 9 is deposited in which a second electrically conducting region 14 is defined. The deposition of the upper layer 9 of electrically conducting material at the same time creates the via 15.

Figure 3:
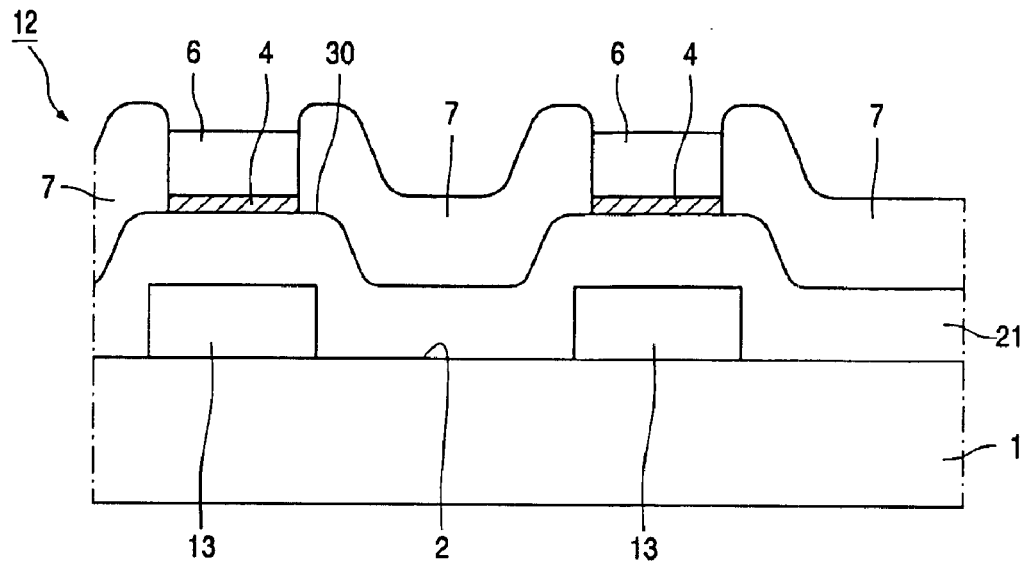
FIG. 3 is a diagrammatic cross-sectional view of a semi-manufactured product resulting from a second embodiment of the method.

FIG. 3 shows a semi-manufactured product 12 provided with a substrate having a first side 2. The first electrically conducting regions 13 are present at said first side 2. In this example, said regions 13 lie on the substrate 1, which will normally comprise various components such as resistors and transistors. Alternatively, however, the electrically conducting layer 13 may lie in the substrate 1 in the form of a doped zone. The substrate 1 is further provided with an intermediate layer 21. The surface 30 of this intermediate layer 21 is modified. A monolayer 4 is deposited on this intermediate layer 21 in a desired pattern. A composition is provided thereon which comprises a first and a second polymer. A first sub-layer 6 with the first polymer is deposited on the monolayer 4. A second sub-layer 7 with the second polymer is deposited next to the monolayer 4, i.e. on the intermediate layer 21.

Figure 4:
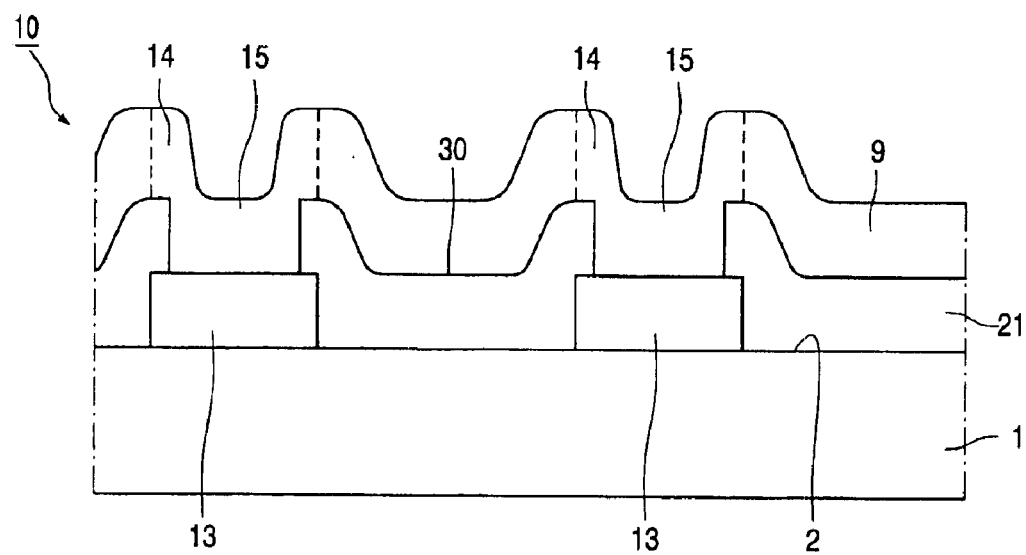
FIG. 4 is a diagrammatic cross-sectional view of a device resulting from the second embodiment of the method.

FIG. 4 shows a device 10 resulting from the semi-manufactured product 12. First the first sub-layer 6 and the monolayer 4 are removed. Then the intermediate layer 21 is etched, for which the second sub-layer 7 is used as an etching mask. Then the second sub-layer 7 is removed, and an upper layer 9 of electrically conducting material is deposited, with the electrically conducting regions 14 and the vias 15.

Embodiment 1

A 5 nm thick layer of Ti and a 20 nm thick layer 3 of Au was provided on a glass substrate 1 by vacuum deposition in a known manner. The surface of the gold layer 3 was modified in accordance with a desired pattern in that a monolayer 4 of HS(CH$_2$)$_{18}$OH was provided in a desired pattern. This was done with a stamp made of PDMS suitable for contact printing and provided with a patterned stamp surface. The stamp was impregnated at the stamp surface with a solution of HS(CH$_2$)$_{18}$OH in ethanol for providing the monolayer. The desired pattern of a via was defined as negative; the entire surface was provided with the monolayer, except for the vias. These vias had a square shape and dimensions between 1 and 25 $\mu m^2$. The mutual distance between vias was 20 to 50 $\mu m$. Subsequently, a solution of octadecylthiole, HS(CH$_2$)$_{17}$CH$_3$, was provided on the substrate provided with the metal layer and the monolayer. The result was that the as yet uncovered portion of the surface of the gold layer was covered with a second monolayer 5. Any remaining octadecylthiole was removed by rinsing with ethanol. Then a composition of a first polymer and a second polymer in a solvent was provided by spinning. The first polymer was polystyrene with a Mw 90900 and Mw/Mn=1.05. The second polymer was poly(2-vinylpyridine) with an Mw 115000 and Mw/Mn=1.03. The solvent was tetrahydrofurane. Spinning was done in a Karl Süβ RC8 spin coater with Gyrset (open lid: 1000 rpm, 200 rpm/s, 5 s, closed lid: 3000 rpm, 1000 rpm/s, 10 s). The composition contained 0.75% by weight of polystyrene and 0.75% by weight of polyvinylpyridine. The solution further comprised 250 mg/l of 2.6-di-tert-butyl-4-methylphenol for stabilizing the solvent. The temperature was 21±0.5° C., the relative humidity 50±5%. The composition provided by spin coating was dried during spinning under closed lid conditions. The result was that the composition was split up into a first 6 and a second sub-layer 7. The first sub-layer 6 with the first polymer—polystyrene—selectively deposited itself on the monolayer 5 of octadecylthiole. The second sub-layer 7 with the second polymer—poly(2-vinylpyridine)— deposited itself on the monolayer 4 of octadecylthiole. The first sub-layer 6 was removed by rinsing three times with cyclohexane. The second sub-layer 7 serves as the intermediate layer. A 5 nm thick layer of Ti and a 20 nm thick upper layer 9 of Au were subsequently deposited by vacuum deposition. The via 15 was thus completed with the electrically conducting regions 13, 14 in the layers of Au.

Embodiment 2

After the removal of the first sub-layer and before the deposition of the second Au layer, the monolayer 5 of octadecylthiole was removed. This was done in that the monolayer was exposed to radiation with a wavelength of 254 nm and an intensity of approximately 4 mW/cm$^2$ for 15 minutes. The treatment was carried out without a mask.

Embodiment 3

The layer 3 of Au was patterned prior to the provision of the monolayer 4 of $HS(CH_2)_{18}OH$. To this end, a monolayer of hexadecylthiole, $HS(CH_2)_{15}CH_3$, was provided in accordance with a desired pattern by microcontact printing. The stamp surface of a stamp was impregnated with a 10 mM solution of the hexadecylthiole. The stamp was dried for 20 to 30 seconds in $N_2$ and applied to the surface of the Au layer. The surface was rinsed with ethanol and blown dry with $N_2$. Then the surface was brought into contact with a solution of 1 mmole potassium thiosulphate, 0.1 mmole potassium-iron cyanide, and 10 mmole potassium hydroxide in water for 10 minutes. The uncovered portions of the Au were etched away thereby. After rinsing with water, the monolayer was removed in a non-oxidizing plasma treatment such as the one described in embodiment 2.

Embodiment 4

An intermediate layer 21 of $SiO_2$ is formed in a known manner on a substrate 1 with a conducting region 13. The intermediate layer 21 of $SiO_2$ has a thickness of 80 nm. A monolayer 4 of octadecyltrichlorosilane is provided thereon in accordance with a desired pattern by means of microcontact printing. The monolayer 4 is provided in the pattern wherever a via is desired. This is done with a stamp provided with a stabilized stamp surface such as described in International Application Published under PCT (WO 01/159523 A1) titled, "Stamp for Use in Lithographic Process, Method of Manufacturing a Stamp, and Method of Manufacturing a Patterned Later on a Substrate," Application was originally filed on Feb. 7, 2000. Vias are defined in this manner with mutual distances of 10 μm and dimensions of 2 by 2 μm. A composition of a first and a second polymer is provided by means of spin coating. The first polymer is polystyrene. The second polymer is PMMA. The composition is dried, during which a first sub-layer 6 with the first polymer arises on the monolayer 4. A second sub-layer 7 with the second polymer arises on the surface of the intermediate layer 21. The first sub-layer 6 is subsequently removed by rinsing three times with cyclohexane. Any remaining cyclohexane is removed through rinsing with ethanol. The monolayer 4 is removed in a plasma treatment in oxygen. Then the intermediate layer 21 is etched in that it is entirely immersed in a 1% HF solution in water. The second sub-layer 7 serves as an etching mask during this. After etching, rinsing takes place with water and ethanol, whereupon the product is dried. An upper layer 9 of electrically conducting material is subsequently provided in that a 5 nm thick layer of Ti and a 25 nm thick layer of Au are vapor-deposited. This conducting layer is patterned by means of contact printing or photolithography.

Embodiment 5

A 5 nm thick layer of Ti is vapor-deposited on a substrate. Then a 25 nm thick layer of Au is vapor-deposited. A photoresist, HPR 504, is provided by spin coating and patterned in a usual manner. Then an etchant comprising $KI/I_2$ is provided, whereby the Au not covered by the photoresist is removed. The uncovered portions of the Ti layer are subsequently removed with an etchant based on $HF/HNO_3/H_2$. The substrate with the layers present thereon—also referred to as the wafer hereinafter—is cleaned with water and dried. Any remaining photoresist is removed with acetone. The wafer is then cleaned with water and isopropanol and dried in an oven for 1 hour at 125° C.

The wafer is now immersed in fuming $HNO_3$ for 30 minutes. Then it is cleaned with demineralized water and dried on a hotplate at 125° C. for 30 minutes. Then the wafer is exposed to an oxygen plasma treatment for 1 hour at 110° C. After the wafer has cooled down to room temperature, a 300 nm thick layer of a dielectric material is provided. In this case, the photoresist HPR 504 is used for this purpose. The layer is patterned by usual exposure and development procedures. The layer is subsequently baked at 200 to 210° C. for 30 minutes.

A 5 nm thick layer of Ti and a 25 nm thick layer of Au are vapor-deposited on this layer of dielectric material. The metal layer is patterned in the manner described above.

Embodiment 6

A Ti layer and an Au layer are provided on a substrate and patterned in the manner described above. The resulting wafer is cleaned with water and isopropanol and dried in an oven for 1 hour at 125° C. Then the wafer is immersed in a 1 mM solution of hexadecanethiol ($CH_3$—$(CH_2)_{15}$—SH) in ethanol for 30 seconds. The wafer is then blown dry with $N_2$. This results in a self-assembled monolayer of hexadecanethiol on the surface of the Au layer. Then a 300 nm thick layer of dielectric material is provided. The photoresist HPR 504 is used for this purpose here. The layer is patterned by usual exposure and development procedures. The layer is subsequently baked at 200 to 210° C. for 30 minutes. A 5 nm thick layer of Ti and a 25 nm thick layer of Au are vapor-deposited on this layer of dielectric material. The metal layer is patterned in the manner described above.

REFERENCE EXAMPLE 1

A Ti layer and an Au layer are provided on a substrate and patterned in the manner described above. The resulting wafer is cleaned with water and isopropanol and dried in an oven for 1 hour at 125° C. Then a 300 nm thick layer of the photoresist HPR 504 is provided. The layer is patterned by usual exposure and development procedures. The layer is subsequently baked at 200 to 210° C. for 30 minutes. A 5 nm thick layer of Ti and a 25 nm thick layer of Au are vapor-deposited on this layer of dielectric material. This metal layer is patterned in the manner described above.

Embodiment 7

The structures obtained with embodiments 5 and 6 and the reference example 1 were subjected to tests for measuring results. The structures were patterned for this purpose by means of a "process monitor" (PCM) mask set. The structures thus comprise lines and intervening spaces of various lengths and widths, and interdigitated electrode pairs.

Leakage currents between the interdigitated electrode pairs in one metal layer were determined as a function of the distance between the two electrodes. No significant differences were found between the various methods of providing the layer of dielectric material. Leakage currents were found with values below 1 pA with the use of lines and spaces having a width of 1 μm. Resistance values of 30 Ω were found independently of the line width (20 to 1 μm).

The metal-insulator-metal structures were further characterized by means of I-V measurements for determining undesirable top-down leakage currents as a function of the applied bias. At a bias of 10 V, the results were for a capacitor with a surface area of 0.25 mm$^2$:

a leakage current of less than 1 pA for the structure manufactured in accordance with embodiment 5;

a leakage current of less than 1 pA for the structure manufactured in accordance with embodiment 6; and a leakage current of more than 1 μA for the structure manufactured in accordance with the reference example 1.

The leakage currents of the structures of embodiments 5 and 6 were measured through impedance measurements with a Schlumberger 1260 Impedance Gain-Phase Analyzer. An average value of $1.4\times10^{-8}$ F/cm$^2$ was found.

The structure of comparison example 1 was subsequently visually analyzed for pinholes. A liquid crystalline material was provided for this purpose, which melted at the area of a pinhole owing to local heating in situ. It was observed in this manner that the pinholes were randomly distributed over the surface. It was thus ascertained that the pinholes are not caused by a bad coating at the edges.

What is claimed is:

1. A method of manufacturing an electronic device provided with a substrate having a first side, at which first side are provided in that order a first electrically conducting region, an intermediate layer of electrically insulating material, and a second electrically conducting region, an electrically conducting vertical interconnect being present between said regions, characterized in that the method comprises the following steps:

modifying a surface at the first side of the substrate in accordance with a desired pattern, which pattern defines the via, thus forming a modified portion and a remaining portion of the surface;

providing a composition on the surface, which composition comprises a first and a second polymer and a solvent, said solvent substantially wetting the surface, whereby a first and a second sub-layer are formed under phase separation, each of said sub-layers comprising substantially one of the polymers, while the first sub-layer lies on the first electrically conducting region;

etching the first sub-layer with a first etchant; and providing the vertical interconnect and the second electrically conducting region.

2. A method as claimed in claim 1, characterized that the step of modifying the surface is performed by means of microcontact printing, whereby a monolayer is created.

3. A method as claimed in claim 2, characterized in that a composition is provided after the provision of the first monolayer, which composition comprises a compound which forms a second monolayer on the remaining portion of the surface; and the first and the second monolayer each comprise a compound provided with an end group, which end group faces away from the surface after the formation of the respective monolayer, while the end group of the compound of the second monolayer differs from the end group of the compound of the first monolayer in its polarity.

4. A method as claimed in claim 1 or 2, characterized in that the modified portion of the surface is present on the first electrically conducting region, and in that the first sub-layer comprises the first polymer.

5. A method as claimed in claim 1 or 2, characterized in that the surface of the intermediate layer is modified, and after etching with the first etchant the intermediate layer is patterned through etching with a second etchant.

6. A method as claimed in claim 2 or 3, characterized in that the first electrically conducting region forms part of a metal layer, and the surface of the metal layer is modified.

7. A method as claimed in claim 6, characterized in that the metal layer comprises gold, and the monolayer comprises a thiole.

8. A method as claimed in claim 6 or 7, characterized in that the intermediate layer is a dielectric of a thin-film transistor whose electrodes are present in the metal layer and in an upper layer which comprises the second electrically conducting region, and a channel layer of semiconductor material is present, in contact with the intermediate layer and with either the metal layer or the upper layer.

9. A method as claimed in claim 6 or 7, characterized in that the electrically insulating material of the intermediate layer is a low-K material.

10. A method as claimed in claim 3 or 4, characterized in that the monolayer present on the first electrically conducting region is removed before the second electrically conducting region is provided.

* * * * *